United States Patent [19]

Itani

[11] Patent Number: 4,475,078
[45] Date of Patent: Oct. 2, 1984

[54] SYSTEM FOR READING MAGNETIC SENSORS FOR FAULT LOCATION IN GAS-INSULATED ELECTRICAL APPARATUS

[75] Inventor: Abdallah M. Itani, Ballston Spa, N.Y.

[73] Assignee: Electric Power Research Institute, Inc., Palo Alto, Calif.

[21] Appl. No.: 218,503

[22] Filed: Dec. 22, 1980

[51] Int. Cl.³ .................. G01R 31/08; G01R 33/025; G01R 33/04
[52] U.S. Cl. ..................................... 324/52; 324/244; 324/254
[58] Field of Search .................. 324/52, 51, 244, 249, 324/253–255, 117 R, 102, 103 R, 103 P, 127; 340/659, 660, 664

[56] References Cited

U.S. PATENT DOCUMENTS

| | | | |
|---|---|---|---|
| 1,942,052 | 1/1934 | Foust et al. | 324/103 P |
| 2,291,692 | 8/1942 | Cloud | 324/346 |
| 2,434,933 | 1/1948 | Kinyon et al. | 324/103 P |
| 2,696,602 | 12/1954 | Evans | 324/253 X |
| 2,861,242 | 11/1958 | Leavitt | 324/254 |
| 3,064,185 | 11/1962 | Ferguson | 324/254 |
| 3,266,640 | 12/1965 | Kuhrt et al. | 324/127 X |
| 3,274,488 | 9/1966 | Washkurak et al. | 324/244 |
| 3,286,169 | 11/1966 | Slonczewski | 324/254 |
| 3,416,072 | 12/1968 | Fussell et al. | 324/249 |
| 3,649,912 | 3/1972 | Nakamura | 324/117 R X |
| 3,983,475 | 9/1976 | Watanabe et al. | 324/254 |
| 4,277,751 | 7/1981 | Lawson et al. | 324/254 |

FOREIGN PATENT DOCUMENTS 31415 7/1971 Japan ...................................... 324/52

OTHER PUBLICATIONS

Perry, M. P., "Fault Location in Gas-Insulated Conductors Using Magnetic Sensors", IEEE Transion Pwr. App. and Sys., vol. PAS-99, No. 4, Jul./Aug. 1980, pp. 1543–1546.

Primary Examiner—Gerard R. Strecker
Attorney, Agent, or Firm—Flehr, Hohbach, Test, Albritton & Herbert

[57] ABSTRACT

A fault location system for use with sealed, gas-insulated electrical power apparatus. The system includes a sensor for placement in close proximity to the outer surface of a housing of the apparatus and a detector for in-place reading of the sensor. The detector comprises a first fluxgate magnetometer for detecting magnetization of the sensor. A second fluxgate magnetometer is positioned adjacent and parallel to the first magnetometer to detect only the background magnetic field. An alternating current electrical signal is applied to the magnetometers. A direct current is then automatically generated wherein the direct current is a function of the even harmonics of the ac output of the second magnetometer. The direct current is used to cancel the effects of the background magnetic field detected by the second magnetometer. As such, the direct current is applied to the first magnetometer to cancel the effects of the background magnetic field therefrom.

26 Claims, 5 Drawing Figures

U.S. Patent  Oct. 2, 1984  Sheet 1 of 2  4,475,078
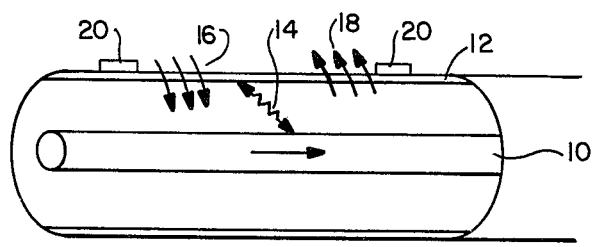
FIG.—1
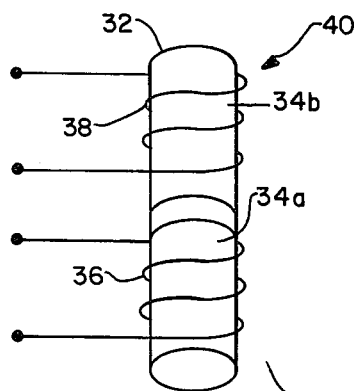
FIG.—3
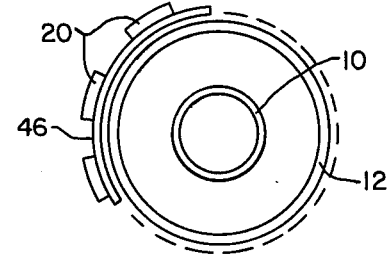
FIG.—5
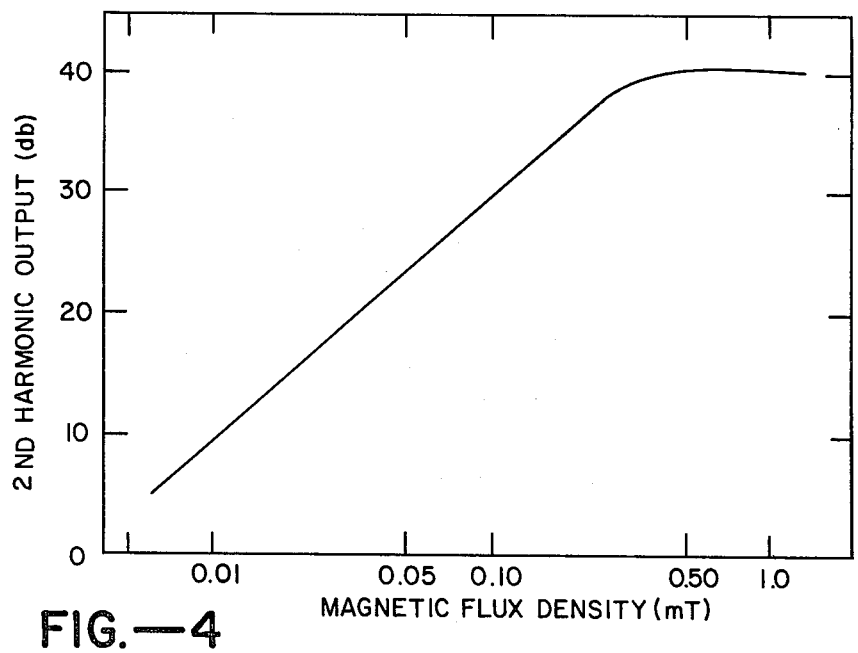
FIG.—4

SYSTEM FOR READING MAGNETIC SENSORS FOR FAULT LOCATION IN GAS-INSULATED ELECTRICAL APPARATUS

This invention relates generally to electrical fault sensing systems, and more particularly the invention relates to a sensor system for sensing electrical faults within sealed, gas-insulated electrical power apparatus.

Sealed, gas-insulated equipment is finding great applicability in electric power applications such as in substations. Typically, compressed sulfur-hexafluoride ($SF_6$) gas will be used as the insulating medium. Compactness, improved aesthetics, freedom from electrostatic field, and lower installment costs in EHV and UHV applications will likely increase the use of such gas-insulated equipment.

However, problems are presented in maintaining and servicing such enclosed gas-insulated equipment. In particular, electrical faults such as arcing between the current carrying components and the outer housing are difficult to locate.

A system proposed heretofore for locating faults within gas-insulated electrical power apparatus makes use of the fact that a magnetic field is induced in the outer housing of the apparatus when a fault occurs. To detect the fault location, this system employs small permanent magnetic sensors mounted about the outer housing of the apparatus.

When a fault occurs, the sensors nearest the fault are magnetized, leaving behind a permanent record of the fault location. At a later time, the magnetic sensors can be "read" to determine the fault location.

The sensors are read by placing them in close proximity to a fluxgate magnetometer or sensor coil, applying an alternating current electrical signal to the coil, and detecting the voltage across the coil. To detect the fault, the voltage across the coil can be compared with the alternating current signal and phase shifts in the detected voltage noted. In normal operation, the detected voltage will have a fixed phase relationship with the applied signal. However, arcing due to a fault causes the sensor to become permanently magnetized, and the magnetic field produced by the sensor causes a phase shift in the voltage across the coil. Thus, by detecting the phase shift in the coil voltage, a fault within the electrical apparatus in close proximity to the sensor is detected. The basic concept of this system is described in an article by M. P. Perry, "Fault Location in Gas Insulated Conductors Using Magnetic Sensors", IEEE Transactions on Power Apparatus and Systems, Vol. PAS-99, No. 4, July/August 1980. The fault location system is also the subject of co-pending U.S. patent application Ser. No. 103,163, filed Dec. 13, 1979, now abandoned, entitled METHOD AND MEANS FOR DETECTING FAULTS IN SEALED ELECTRICAL APPARATUS, and assigned to the assignee of the present invention.

In actual use of the above-described system in a substation, for example, literally thousands of magnetic sensors would have to be positioned about the substation. Thus, from a practical standpoint, the sensors should be able to be read "in-place". That is to say, the sensors may be read without removing them from the equipment on which they are mounted.

The presence of the earth's or any other background magnetic field, however, presents problems in making an in-place reading. The earth's magnetic field, which is about 0.05 millitesla, is much stronger than the magnetic field produced by the sensor, which is about 0.005 millitesla. The sensor's magnetic field is therefore buried in the background magnetic field of the earth. The sensor coil cannot "see" the magnetic field produced by the sensor.

One way to eliminate the effects of the earth's magnetic field from the sensor coil is to bias the sensor coil with a dc supply of current from a dc voltage source. The magnitude and sign of the dc current from the dc source are adjusted to produce a magnetic field which is equal in intensity and opposite in direction to the background magnetic field at the sensor coil. This cancels the effects of the background magnetic field from the sensor coil. To accomplish this, the magnetic sensor is removed from the vicinity of the sensor coil and the dc current is manually adjusted until the detector circuit output, which measures the output of the sensor coil, is zero. When the output of the detector circuit is zero, it is known that the background magnetic field has been cancelled from the sensor coil. This, however, is not a very practical method for in-place reading of the magnetic sensors.

Another way to cancel the background magnetic field is to use a "ring-core" magnetometer as the sensor coil. A ring-core magnetometer comprises a toroidal core of nonpermeable material wound with a formex wire in a symmetric manner. Contained within the turns of the wire is a uniform distribution of magnetically permeable material which saturates at a very low magnetic field, about several millioersteds. A uniform external magnetic field, such as the earth's magnetic field, imposed on the toroidal ring-core magnetometer does not effect the magnetometer's output. The ring-core magnetometer is immune from any external magnetic field which does not vary from one position to the next. If however a non-uniform magnetic field is applied to the toroidial magnetometer, such as that produced by a magnetic sensor, the output signal of the magnetometer will change.

An object of the present invention is an improved fault-location system for use with sealed, gas-insulated electrical apparatus in which magnetic sensors mounted on the outer housing of the apparatus may be read in-place.

Another object of the present invention is an improved system for detecting and locating electrical faults within gas-insulated electrical apparatus wherein the effects of any background magnetic field are automatically eliminated from the system.

Yet another object of the invention is a fault sensor and detector system which can be readily applied to existing installed apparatus.

In accordance with the present invention, a fault location system for use with sealed electrical power apparatus is provided. The system includes a body of permanently magnetizable material for placement in close proximity to the outer surface of a housing of the apparatus. A first fluxgate magnetometer means is provided for placement in close proximity to the body to detect magnetization of the body. A second fluxgate magnetometer means is positioned adjacent and parallel to the first magnetometer means to detect only the background magnetic field. An alternating current electrical signal is applied to both magnetometer means. A direct current that is a function of the even harmonics of the ac output of the second magnetometer means is generated in order to cancel the effects of the background magnetic field detected by the second magnetometer means. This direct current is applied to the first magnetometer means to cancel the effects of the background magnetic field therefrom.

The invention and objects and features thereof will be more readily apparent from the following detailed description and appended claims when taken with the drawings wherein:

FIG. 1 is a sectional view of a sealed, gas-insulated electrical apparatus in which the present invention may be employed;

FIG. 3 is a schematic view of the sensor fluxgate magnetometer and the reference fluxgate magnetometer of the present invention;

FIG. 4 is a plot of the second harmonic content of the magnetometer output voltage versus the dc magnetic flux density applied to the magnetometer; and FIG. 5 illustrates an arrangement of a plurality of sensors on the outer housing of the gas-insulated electrical apparatus.

Figure 2:
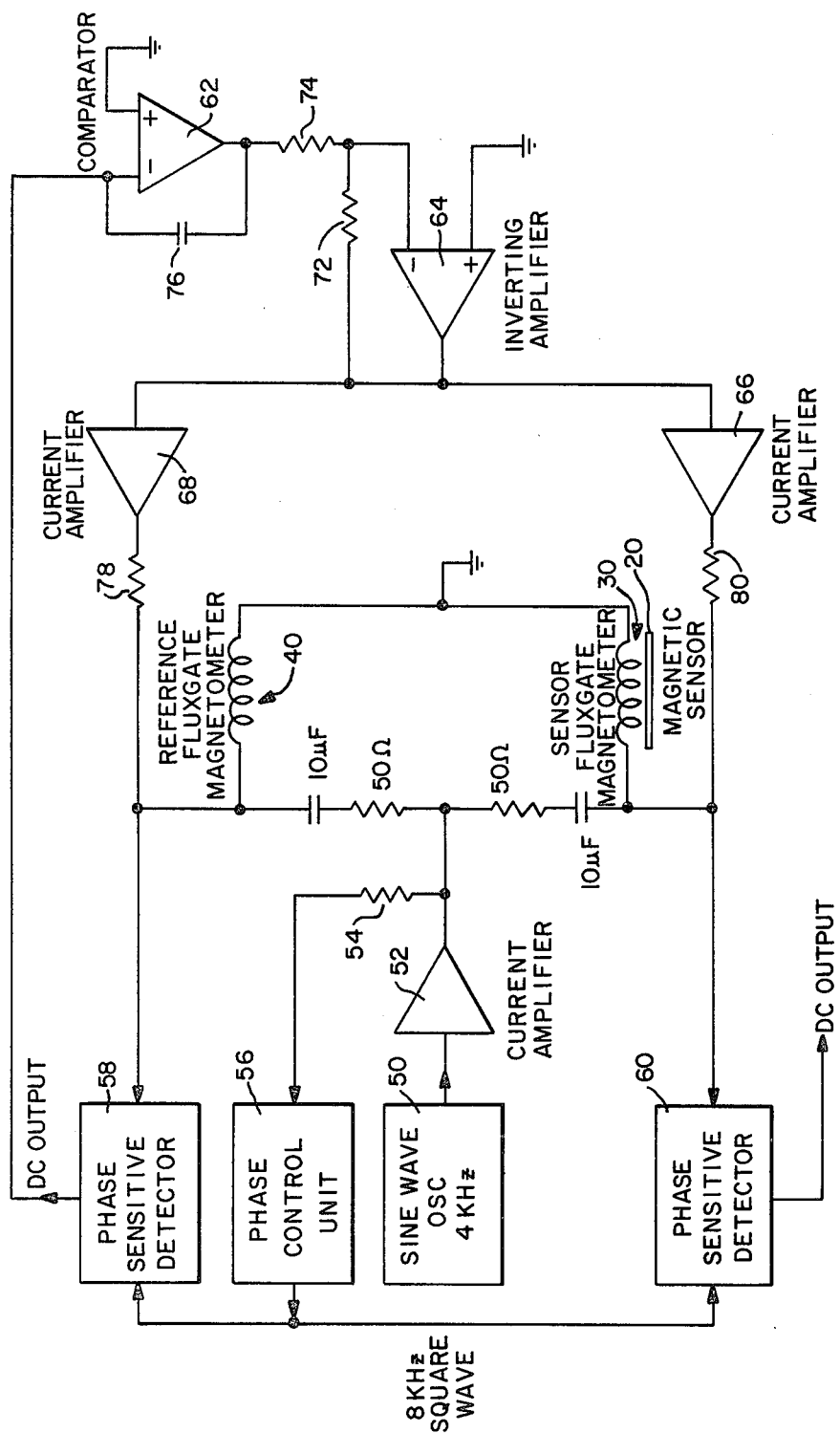
FIG. 2 is an electrical block diagram of the system of the present invention.

Referring now to the drawings, FIG. 1 is a sectional view of a sealed, gas-insulated electrical apparatus in which the present invention may be employed. The apparatus illustrated is a coaxial transmission line in which current flows through inner conductor 10 which is placed within an outer housing 12 and is insulated therefrom by means of a suitable dielectric such as compressed sulphur-hexafluoride ($SF_6$) gas. It is to be understood that the present invention may be used with other types of sealed electrical apparatus.

Upon the occurrence of a fault in the electrical apparatus, the current in conductor 10 arcs over to the housing 12 as indicated at 14. Such electrical arcing produces a magnetic field in the surface of housing 12 as indicated by the arrows 16 and 18.

In accordance with the present invention, sensor 20 is provided on the outer surface of housing 12 to sense the presence of an induced magnetic field, as indicated by arrows 16 and 18, due to the occurrence of an electrical fault. In one embodiment, the sensor comprises a permanently magnetizable material such as iron-cobalt-vanadium steel which is designated P-6 steel. For use with an electrical apparatus operating at 60 hertz, the sensor is preferably 1.6 centimeters long, 0.32 centimeters wide, and 0.025 centimeters thick. The sensor is longer than it is wide so that the magnetization effects are reduced and whereby the external field applied to the sensor is transmitted to the magnetic material.

The P-6 material exhibits a low coercivity and a high remanent induction, for example, about 2.0 kA/m and about 1.0 Tesla, respectively. These properties are desirable for use in the present invention, since the magnetic fields produced by the faults may be as low as 0.5 millitelsa. The high remanence allows convenient detection at a later time to determine the fault location.

FIG. 2 is an electrical block diagram of a fault detector in accordance with one embodiment of the present invention. The detector includes a first fluxgate magnetometer or sensor coil 30 for placement in close proximity to sensor 20. Magnetometer 30 detects magnetization of the sensor. To detect any background magnetic field, such as the earth's magnetic field, a second fluxgate magnetometer or reference coil 40 is also provided.

The reference magnetometer is placed adjacent and parallel to the sensor magnetometer so that the reference magnetometer "sees" the same background magnetic field that the sensor magnetometer "sees." As the effects of background magnetic field change with a change in direction of the magnetometer, the sensor and reference magnetometers must be "looking" in the same direction. The reference magnetometer, however, should not "see" the magnetic field produced by sensor 20.

The fluxgate magnetometers comprise a magnetically permeable material about which a coil is wound. In a preferred embodiment, as illustrated in FIG. 3, the sensor and reference magnetometers 30 and 40, respectively, comprise a teflon rod 32 on which is formed two sections 34a and 34b of magnetically permeable material. The magnetically permeable material is Supermalloy which magnetically saturates in response to the application of a very small magnetic field. The teflon rod and section 34a comprise a core about which coil 36 of magnetometer 30 is wound. The teflon rod and section 34b comprise a core about which coil 38 of magnetometer 40 is wound. Sections 34a and 34b of the Supermalloy material are spaced about a half an inch from one another to be insulated from each other by the teflon. The half inch spacing is enough to prevent the reference magnetometer from seeing the magnetic field produced by sensor 20. The reference magnetometer only sees or detects the background magnetic field. But as the sensor and reference magnetometers are adjacent and their axes are substantially parallel, reference magnetometer 40 sees the same background magnetic field as does sensor magnetometer 30.

Referring again to FIG. 2, it can be seen that a signal generator 50 is electrically connected to magnetometers 30 and 40 for the application of an alternating current electrical signal. In a preferred embodiment, signal generator 50 applies a 4 kilohertz sine wave signal to the magnetometers. The signal is applied through a current amplifier 52 to provide an output current of approximately 200 milliamps RMS. The output of the amplifier is fed to the respective magnetometers through a 50 ohm resistor and a 10 microfarad capacitor. The output of the current amplifier is also fed through a current-limiting resistor 54 to a phase control unit 56. In a preferred embodiment, resistor 54 has a value of 10 kiloohms and the phase control unit is Type 4114, manufactured by Evans Associates, Berkeley, Calif.

The phase control unit generates two concurrent gating outputs which have equal on and off intervals, regardless of the input waveform. The two gating outputs are mutually orthogonal in phase at the fundamental input frequency. Here, second harmonic output gating is used to generate an 8 kilohertz square wave that is in phase with the 4 kilohertz sinusoidal excitation signal. The 8 kilohertz phase-locked square wave is then fed to two phase sensitive detectors 58 and 60. The phase sensitive detectors are analog circuit modules that generate a dc output of between 0 and 10 volts. Preferably, the phase sensitive detectors are Types 4110, manufactured by Evans Associates, Berkeley, Calif. They are designed to interface with the phase control unit.

The 8 kilohertz phase-locked square wave acts as a reference signal for the two phase sensitive detectors. The ac output signals from the magnetometers are fed into respective phase sensitive detectors to be compared with the 8 kilohertz reference signal. Each phase sensitive detector generates a dc output which is proportional to the cosine of the relative phase angle between the output signal from its magnetometer and the reference signal.

With the application of the 4 kilohertz excitation signal, the output voltage of the magnetometers is a triangular-shaped periodic signal. When no dc magnetic field, such as the earth's or the sensor's, is present, the output signal of each magnetometer contains only odd harmonics. When a dc magnetic field is applied to the magnetometers, the magnometers' output voltage contains even harmonics. The application of a dc magnetic field to the magnetometers also produces a phase shift in the magnetometers' output voltage. The dc magnetic field causes saturation of the magnetometer core which produces the phase shift in the magnetometer output voltage. The amount of the phase shift provides an indication of the strength or density of the magnetic field imposed on the magnetometers.

The output signal from magnetometers 30 and 40 is fed into phase sensitive detectors 58 and 60, respectively, where it is compared with the 8 kilohertz reference signal that is phase-coherent with the 4 kilohertz excitation signal. As indicated heretofore, when a dc magnetic field—in this case any background magnetic field—is imposed on magnetometer 40, the output voltage of magnetometer 40 will contain even harmonics and be out of phase with the reference signal. Detector 58 will then cause a direct current to be generated that is proportional to the cosine of the phase angle between the reference signal and the output signal of magnetometer 40. The amount of the phase shift is directly proportional to the density of the magnetic field; thus, as the magnetic field increases, the output of the detector increases. It may also be said that the detector generates a dc output which is directly proportional to the second harmonic content of the magnetometer output voltage. As shown in FIG. 4, as the density of the magnetic field applied to the magnetometer increases, the second harmonic content of the magnetometer output voltage increases.

The dc output of detector 58 is fed into the inverting input of comparator 62 where it is compared with the non-inverting input which is set at zero volts. The comparator is a high input impedance, high gain operational amplifier. The output voltage of the comparator is equal to the open loop gain times the difference between the two voltages at the inverting and non-inverting inputs. A capacitor 76 is connected across the inverting input and output of the comparator in order to decrease the gain of the comparator.

The output of the comparator 62 is fed to inverting amplifier 64. The inverting amplifier has a unity gain as resistors 72 and 74 are of equal value and are preferably 10 kilo-ohms. The inverting amplifier reverses the polarity of the direct current output from the comparator. By reversing the sign of the dc current, the magnetic field produced at magnetometers 30 and 40 by the passage of the dc current through the magnetometers will be opposite in direction to the background magnetic field.

From inverting amplifier 64, the dc current is fed into magnetometer 30 through current amplifier 66 and current limiting resistor 80. The dc current from amplifier 64 is also fed into magnetometer 40 through current aplifier 68 and current limiting resistor 78. As discussed heretofore, the magnitude and sign of the dc current are sufficient to produce a magnetic field which cancels or nulls the background magnetic field acting on the magnetometers.

With the system of the present invention, detector 58 generates a dc output until a magnetic field is produced at magnetometer 40 that cancels the background magnetic field. When a dc current which cancels the background magnetic field from magnetometers 30 and 40 is generated, the output of detector 58 becomes substantially zero. If the output of detector 58 is not zero due to the background magnetic field, the output of detector 58 being fed to the comparator, a voltage level of between $-10$ volts and $+10$ volts is generated at the output of the comparator, forcing a dc current into magnetometers 30 and 40. This cancels the external magnetic field and therefore reduces the output of detector 58 to a level very close to zero, but at the same time, the dc current from the comparator is at a level which is sufficient to cancel the background field.

When a voltage E is applied to the inverting input of the comparator which has an open loop Gain A, the output voltage $E_o$ of the comparator will be $E_o = -AE$. Thus the voltage on the right-hand side of capacitor 76 is $-AE$ volts. Hence the voltage $E_c$ across capacitor 76 is $$E_c = E - E_o = E - (-AE) = (1+A)E$$

Therefore the charge stored in capacitor 76 is $$Q = C(1+A)E = C_{eq}E$$

Where C is the capacitance of capacitor 76 and the equivalent capacitance $C_{eq}$ is $$C_{eq} = C(1+A)$$

The reason capacitor 76 is $(1+A)$ times larger than the source voltage E is because of the large voltage difference, $(1+A)$ E volts, developed across it.

Therefore when the comparator is connected in the negative feedback loop as in FIG. 2 any small voltage E will produce a negative voltage $E_o$ at the output of the comparator. Voltage $E_o$ creates a field opposite in direction to the background field in the magnetometers, thus canceling the effect of the background magnetic field and reducing the output of detector 58 to almost zero and the comparator output to a level where it satisfies the equation $E_o = -AE$. When this occurs, the ac output of magnetometer 40 no longer contains even harmonics and is no longer out of phase with the reference signal. Thus, the dc output of detector 58 becomes substantially zero.

As the dc output from inverting amplifier 64 is also fed to magnetometer 30, a magnetic field is produced at magnetometer 30 that cancels the effects of the background magnetic field from magnetometer 30. This allows sensor magnetometer 30 to see only the magnetic field produced by the magnetization of sensor 20.

The ac output from sensor magnetometer 30 is fed to phase sensitive detector 60. The dc output of detector 60 is proportional to the remanent magnetization of magnetic sensor 20. Specifically, detector 60 generates a dc output which is proportional to the cosine of the phase angle between the 8 kilohertz reference signal and the ac output of magnetometer 30. As noted above, the dc magnetic field produced by the magnetization of the sensor causes a phase shift in the magnetometer output voltage. This is due to magnetic saturation of the magnetometer core. To determine the location of the fault, the dc output of detector 60 may be displayed on a digital meter.

FIG. 5 illustrates an arrangement of a plurality of sensors 20 on the outer housing 12 of the gas-insulated electrical power apparatus. Here, sensors 20 are mounted on a fiberglass tape 46 wherein the tape is applied to the outer circumference of the housing. In this arrangement, the detector of the present invention, which, as shown in FIG. 2, includes everything but magnetic sensor 20, is appropriately connected to the sensors. It is expected that the detecting apparatus would test the sensors for magnetization. The sensor that is the most magnetized—and hence produces the greatest phase change between the reference signal and magnetometer output voltage—is the one closest to the fault location.

The system of the present invention has been described as detecting phase shifts between a second harmonic reference signal and the second harmonics contained in the ac output of the magnetometers. The output voltage of the magnetometers contains even harmonics when a dc magnetic field is applied thereto. Thus, it is to be understood that the present invention may be used to detect the phase shift of any even harmonics of the magnetometer output voltage.

Also, while the invention has been described with reference to a specific embodiment and application, the description is illustrative of the invention and is not to be construed as limiting the invention. Various modifications and applications may occur to those skilled in the art without departing from the spirit and scope of the invention as defined by the appended claims.

What is claimed is:

1. A system for locating faults, comprising:
   a body of permanently magnetizable material placed in close proximity to a housing of a sealed electrical power apparatus;
   a first fluxgate magnetometer means placed in close proximity to said body to detect a dc magnetic field produced by the magnetization of said body;
   a second fluxgate magnetometer means positioned adjacent and substantially parallel to said first magnetometer means for detecting only background dc magnetic field;
   means for applying an alternating current electrical signal to said first and second magnetometer means;
   means for generating a direct current that is a function of the even harmonics of the ac output of said second magnetometer means in order to cancel the effects of the background dc magnetic field detected by said second magnetometer means; and
   means for applying said current to said first magnetometer means to cancel the effects of the background dc magnetic field therefrom.

2. The system of claim 2 wherein said body comprises iron-cobalt-vandium steel.

3. The system of claim 1 wherein said first and second magnetometer means include first and second coils wound about a core of magnetically permeable material, said first and second coils being spaced apart and insulated from one another on said core.

4. The system of claim 3 wherein said magnetically permeable material comprises supermalloy.

5. The system of claim 1 wherein said alternating current electrical signal has a frequency on the order of four kilohertz.

6. The system of claim 1 wherein said direct current generating means includes:
   a phase control unit means for converting said alternating current electrical signal to a square wave reference signal phase coherent with said alternating current electrical signal, said reference signal containing only second harmonics; and
   a first phase sensitive detector means for generating a direct current proportional to the cosine of the phase angle between said reference signal and the ac output of said second magnetometer means where said ac output contains even harmonics due to the presence of the background magnetic field.

7. The system of claim 6 further including a second phase sensitive detector means for generating a direct current output proportional to the cosine of the phase angle between said reference signal and the ac output of said first magnetometer means where said ac output contains even harmonics due to the magnetization of said body.

8. The system of claim 7 further including means for displaying the output from said second phase sensitive detector means.

9. The system of claim 1 including a plurality of said bodies spaced about the housing of said apparatus.

10. A system for locating faults, comprising:
    a body of permanently magnetizable material placed in close proximity for a housing of a sealed electrical power apparatus for sensing the presence of a magnetic field induced in the housing when a fault occurs;
    a first fluxgate magnetometer means placed in close proximity to said body to detect the magnetization of said body;
    a second fluxgate magnetometer means positioned adjacent and substantially parallel to said first magnetometer means for detecting the background magnetic field imposed on said first magnetometer means;
    means for applying an alternating current electrical signal to said first and second magnetometer means;
    means for converting said alternating current electrical signal to a reference signal that is phase coherent with said alternating current electrical signal;
    first means for automatically generating a direct current that is a function of the phase shift between the ac output of said second magnetometer means and said reference signal; and
    means for applying said direct current to said first magnetometer means in order to cancel the effects of the background magnetic field from said first magnetometer means.

11. The system of claim 10 wherein said direct current is applied to said first and second magnetometer means.

12. The system of claim 10 wherein said alternating current electrical signal has a frequency of about 4 kilohertz.

13. The system of claim 12 where said reference signal is an 8 kilohertz square wave.

14. The system of claim 13 including a second means for automatically generating a direct current that is a function of the phase shift between said reference signal and the ac output of said first magnetometer means.

15. The system of claim 14 wherein said first and second direct current generating means generate a direct current that is proportional to the cosine of the phase angle between said reference signal and the ac output of said first and second magnetometer means.

16. A system for locating faults, comprising:
- a body of permanently magnetizable material placed in close proximity to a housing of a sealed electrical power apparatus for sensing the presence of a magnetic field produced when a fault occurs;
- a first fluxgate magnetometer placed in close proximity to said body to detect the magnetization of said body;
- a second fluxgate magnetometer positioned adjacent and parallel to said first magnetometer to detect the background magnetic field imposed on said first magnetometer;
- means for applying an alternating current electrical signal to said first and second magnetometers;
- means for converting said alternating current electrical signal to a second harmonic reference signal that is phase coherent with said alternating current electrical signal;
- means for automatically generating a direct current that is proportional to the cosine of the phase angle between said reference signal and the ac output of said second magnetometer, said direct current being generated when said ac output contains second harmonics; and
- means for applying said direct current to said first and second magnetometers in order to cancel the effects of the background magnetic field from said first and second magnetometers.

17. The system of claim 16 wherein said alternating current electrical signal has a frequency of about 4 kilohertz.

18. The system of claim 17 where said reference signal is an 8 kilohertz square wave.

19. The system of claim 18 including means for automatically generating a direct current that is proportional to the cosine of the phase angle between said reference signal and the ac output of said first magnetometer, said direct current being generated when said ac output contains second harmonics.

20. A fault sensor and detector system, comprising:
- a sensor placed in close proximity to a housing of a sealed electrical power apparatus, said sensor including a body of permanently magnetizable material;
- a detector including:
  - (i) a first coil wound about a core of magnetically permeable material placed in close proximity to said sensor to detect the magnetization of said sensor,
  - (ii) a second coil wound about said core parallel to said first coil and insulated therefrom to detect only background magnetic field,
  - (iii) means for applying an alternating current electrical signal to said first and second coils,
  - (iv) means for automatically generating a direct current in response to the presence of even harmonics in the ac output of said second coil to cancel the effects of the background magnetic field detected by said second coil,
  - (v) means for applying said direct current to said first coil to cancel the effects of the background magnetic field therefrom, and
  - (vi) means for generating a direct current in response to the presence of even harmonics in said first coil so as to indicate the location of a fault.

21. The system of claim 20 including a plurality of said sensors spaced about the housing of said apparatus wherein said detector may be operatively coupled to any one of said sensors.

22. A system for locating faults, comprising:
- a body of permanently magnetizable material placed in close proximity to a housing of a sealed electrical power apparatus;
- a sensor fluxgate magnetometer means placed in close proximity to said body to detect the magnetization of said body;
- a reference fluxgate magnetometer means for detecting only background magnetic field;
- means for applying an alternating current electrical signal to said sensor and reference magnetometer means;
- means for generating a direct current that is a function of the even harmonics of the ac output of said reference magnetometer means in order to cancel the effects of the background magnetic field detected by said reference magnetometer means; and
- means for applying said direct current to said sensor magnetometer means to cancel the effects of the background magnetic field therefrom.

23. A method for detecting faults, comprising:
- placing a first fluxgate magnetometer in close proximity to a body of permanently magnetizable material located in close proximity to a housing of a sealed electrical power apparatus;
- detecting the magnetization of said body with a first fluxgate magnetometer;
- detecting the background field imposed on said first magnetometer with a second fluxgate magnetometer;
- applying an alternating current electrical signal to said first and second magnetometers;
- automatically generating a direct current in response to the presence of even harmonics in the ac output of said second magnetometer; and
- applying said direct current to said first and second magnetometers to cancel the effects of the background material therefrom.

24. A method for locating faults, comprising:
(a) providing a body of permanently magnetizable material in close proximity to a housing of a sealed electrical power apparatus wherein said body becomes magnetized by a magnetic field induced in said housing when a fault occurs;
(b) detecting the magnetization of said body with a first fluxgate magnetometer placed in close proximity to said body;
(c) detecting background magnetic field induced in said first magnetometer with a second fluxgate magnetometer positioned adjacent and substantially parallel to said first magnetometer;
(d) applying an alternating current electrical signal to said first and second magnetometers;
(e) generating a direct current in response to the presence of even harmonics in the ac output of said second magnetometer in order to cancel the effects of the background magnetic field detected by said second magnetometer; and
(f) applying said direct current to said first magnetometer to cancel the effects of the background magnetic field therefrom.

25. The method of claim 24 further including generating a direct current that is a function of the ac output of said first magnetometer when said ac output contains even harmonics due to the magnetization of said body.

26. The method of claim 24 wherein step (e) includes:

converting said alternating current signal to a second harmonic reference signal that is phase coherent with said alternating current signal; and
generating a direct current proportional to the cosine of the phase angle between said reference signal and the ac output of said second magnetometer, said direct current being generated only when said ac output contains even harmonics due to the background magnetic field.

* * * * *

UNITED STATES PATENT AND TRADEMARK OFFICE
CERTIFICATE OF CORRECTION

PATENT NO. : 4,475,078
DATED : October 2, 1984
INVENTOR(S) : A. M. Itani

It is certified that error appears in the above—identified patent and that said Letters Patent is hereby corrected as shown below:

In Claim 2, first line thereof, the numeral "2" should be --1--.

In Claim 10, third line thereof, the word "for" should be --to--.

Signed and Sealed this

Third Day of September 1985

[SEAL]

*Attest:*

DONALD J. QUIGG

*Attesting Officer*   Acting Commissioner of Patents and Trademarks - Designate